(12) United States Patent
Wu

(10) Patent No.: US 8,401,510 B2
(45) Date of Patent: *Mar. 19, 2013

(54) COMMON-GATE COMMON-SOURCE TRANSCONDUCTANCE STAGE FOR RF DOWNCONVERSION MIXER

(75) Inventor: Yue Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 198 days.

This patent is subject to a terminal disclaimer.

(21) Appl. No.: 12/859,533

(22) Filed: Aug. 19, 2010

(65) Prior Publication Data

US 2010/0323655 A1 Dec. 23, 2010

Related U.S. Application Data

(63) Continuation of application No. 11/470,556, filed on Sep. 6, 2006, now Pat. No. 7,801,504.

(60) Provisional application No. 60/748,854, filed on Dec. 8, 2005.

(51) Int. Cl.
*H04B 1/26* (2006.01)

(52) U.S. Cl. .................................. 455/313; 455/333

(58) Field of Classification Search ........... 455/313–333
See application file for complete search history.

(56) References Cited

U.S. PATENT DOCUMENTS

| | | | |
|---|---|---|---|
| 6,166,580 A | 12/2000 | Sessions | |
| 6,411,801 B1 | 6/2002 | Kim et al. | |
| 6,417,712 B1 | 7/2002 | Beards et al. | |
| 6,684,065 B2 | 1/2004 | Bult et al. | |
| 6,750,727 B1 | 6/2004 | Sutardja | |
| 6,867,658 B1 | 3/2005 | Sibrai et al. | |
| 6,891,423 B2 | 5/2005 | Bjork et al. | |
| 7,161,406 B1 | 1/2007 | Ferris | |
| 7,801,504 B2 * | 9/2010 | Wu ............................... | 455/313 |
| 2002/0057132 A1 | 5/2002 | Tomita | |
| 2002/0140495 A1 | 10/2002 | Wicke et al. | |
| 2003/0228858 A1 | 12/2003 | Zhang et al. | |
| 2004/0056803 A1 | 3/2004 | Soutiaguine et al. | |
| 2004/0130399 A1 | 7/2004 | Andreani et al. | |
| 2005/0242886 A1 | 11/2005 | Johnson | |

(Continued)

FOREIGN PATENT DOCUMENTS

| | | |
|---|---|---|
| DE | 10345519 | 6/2005 |
| JP | 2001358546 A | 12/2001 |

(Continued)

OTHER PUBLICATIONS

Habib Kilicaslan, Hona-Sun Kim, and Mohammed Ismail, A 1.9GHz CMOS RF Down-conversion Mixer,circuits and Systems, 1997, proceedings of the 40th Midwest Symposium on, U.S., IEEE 1997, vol. 2. pp. 1172-1174.

(Continued)

*Primary Examiner* — Lana N Le
(74) *Attorney, Agent, or Firm* — Eric Ho

(57) ABSTRACT

In an embodiment, a method and apparatus for downconverting a received RF signal in a wireless device where differential signals from an off-chip matching network may be input to a CGCS input stage of a mixer, which downconverts the signals to baseband or some intermediate frequency. The input stage includes a pair of NMOS transistors in a common-gate configuration and a pair of PMOS transistors in a common-source configuration. A potential advantage of the CGCS input stage over the existing CGO transconductance stage configuration is that by adding a common-source stage through the PMOS differential-pair, the transconductance gain is decoupled from the high Q matching network.

6 Claims, 5 Drawing Sheets

U.S. PATENT DOCUMENTS

| | | | |
|---|---|---|---|
| 2006/0014515 | A1 | 1/2006 | Ruelke et al. |
| 2006/0046370 | A1 | 3/2006 | Oh et al. |
| 2006/0046681 | A1 | 3/2006 | Bagheri et al. |
| 2006/0229046 | A1 | 10/2006 | Bult et al. |
| 2007/0087720 | A1 | 4/2007 | Pullela et al. |

FOREIGN PATENT DOCUMENTS

| | | |
|---|---|---|
| JP | 2005522905 T | 7/2005 |

OTHER PUBLICATIONS

Heydari P. et al.. "A Performance Optimized CMOS Distributed LNA for UWB Receivers," Custom Integrated Circuits Conference, 2005, Proceedings of the IEEE 2005, San Jose, CA, USA, Sep. 18-21, 2005, pp. 330-333, IEEE, Piscataway, NJ, USA, XP010874156.

International Search Report, PCT/US06/061819, International Search Authority, European Patent Office, May 6, 2008.

Ravindran et al., A Low Input Impedance Fully Differential CMOS Transresistance Amplifier Using Cascode Regulation: Custom Integrated Circuits Conference, 2005, Proceedings of the IEEE 2005 San Jose, CA, USA, Sep. 18-21, 2005, pp. 648-651, IEEE, Piscataway, NJ, USA, XP010873614.

Translation of Office Action in Japanese application 2008-544671 corresponding to U.S. Appl. No. 12/859,533, citing Habib_Kilicaslan_A_1_9GHz_CMOS_Pgs_1172_1174_year_1997, JP2001358546, US20050242886, JP2005522905, US20030228858, US6867658 and US6750727 dated Nov. 9, 2010.

Written Opinion, PCT/US06/061819, International Search Authority, European Patent Office, May 6, 2008.

European Patent Office, May 6, 2008.

\* cited by examiner

COMMON-GATE COMMON-SOURCE TRANSCONDUCTANCE STAGE FOR RF DOWNCONVERSION MIXER

CROSS-REFERENCE TO RELATED APPLICATION

This application is a continuation of U.S. patent application Ser. No. 11/470,556, filed Sep. 6, 2006 and entitled, "COMMON-GATE COMMON-SOURCE TRANSCONDUCTANCE STAGE FOR RF DOWNCONVERSION MIXER", which claims the benefit of priority to U.S. Provisional Patent Application No. 60/748,854, filed Dec. 8, 2005 and entitled, "COMMON-GATE COMMON-SOURCE TRANSCONDUCTANCE STAGE FOR RF DOWNCONVERSION MIXER", the entire contents of both of which are hereby incorporated by reference.

BACKGROUND

Wireless communication networks are widely deployed to provide various communication services such as voice, packet data, broadcast, messaging, and so on. Examples of such wireless networks include Code Division Multiple Access (CDMA) networks, Time Division Multiple Access (TDMA) networks, Frequency Division Multiple Access (FDMA) networks, and Orthogonal FDMA (OFDMA) networks. These wireless networks may also utilize various radio technologies such as Wideband-CDMA (W-CDMA), cdma2000, and Global System for Mobile Communications (GSM).

Wireless devices used in such wireless networks include receiver sections for converting radio frequency (RF) signals received by an antenna to baseband signals for digital processing. FIG. 1 shows a portion of an exemplary receiver chain 100 in a wireless device. Wirelessly transmitted RF signals are received by antenna 102. The RF signals are amplified by an LNA (low noise amplifier) 104. The amplified signals are passed to an RF interstage bandpass filter 106, typically a surface acoustic-wave (SAW) filter, and the filtered signal is passed back to a mixer 108.

The LNA 104 and mixer 108 are typically provided on an integrated circuit ("IC" or "chip") 110, whereas the bandpass filter 106 is typically provided off-chip. A matching network (MN) 112 may be provided for impedance matching in passing filtered signals from the bandpass filter 106 back to the chip 110. The signals from the matching network 112 are input as differential signals to an input stage 114 of the mixer 108, which downconverts the signal to baseband or some intermediate frequency.

The input stage 114 of the mixer may have a conventional common-gate only (CGO) configuration, as shown in FIG. 2. Differential input signals 202, 204, which are identical but 180° out of phase, from the matching network are provided at the sources of NMOS transistors 206, 208, respectively. The gates of NMOS transistors 206, 208 are coupled through resistors 210, 212, providing the "common-gate" aspect of the circuit. The gate of each NMOS transistor 206, 208 is also cross-coupled to the opposite input signal than that provided to its source. PMOS transistors 220, 222 are connected at their gates through resistors 224, 226 to a constant voltage $V_g$ 228, and connected at their sources to supply voltage $V_{dd}$ 230. The current generated through each NMOS transistor is due to the input signals at its gate and source. The current through each PMOS transistor is constant due to the constant voltages provided at its gate and source. The total current $I_t$ is the sum of the current through the PMOS transistor and NMOS transistor on each column of the circuit.

For a CGO input stage, in order to achieve high gain, the transconductance $g_{mn}$ of the NMOS transistors must be relatively large, which requires a matching network with a very high Q matching factor. Consequently, a potential disadvantage for CGO input stage is high sensitivity to input Q matching factor.

SUMMARY

In various embodiments, a method and apparatus for downconverting a received RF signal in a wireless device are disclosed. In an embodiment method, differential signals from an off-chip matching network may be input to a CGCS input stage of a mixer, which downconverts the signals to baseband or some intermediate frequency. The input stage includes a common-gate stage, which may include a pair of NMOS transistors coupled to a differential input at their gates and sources, and a common-source stage, which may include a pair of PMOS transistors coupled to a current source at their sources, the differential inputs at their gates, and the common-gate stage at their drains, and RF choke inductors coupled between the differential input and ground.

A potential advantage of an embodiment method using the CGCS input stage over the existing CGO transconductance stage configuration is that by adding a common-source stage through the PMOS differential-pair, the transconductance gain is decoupled from the high Q matching network.

DETAILED DESCRIPTION

Figure 1:
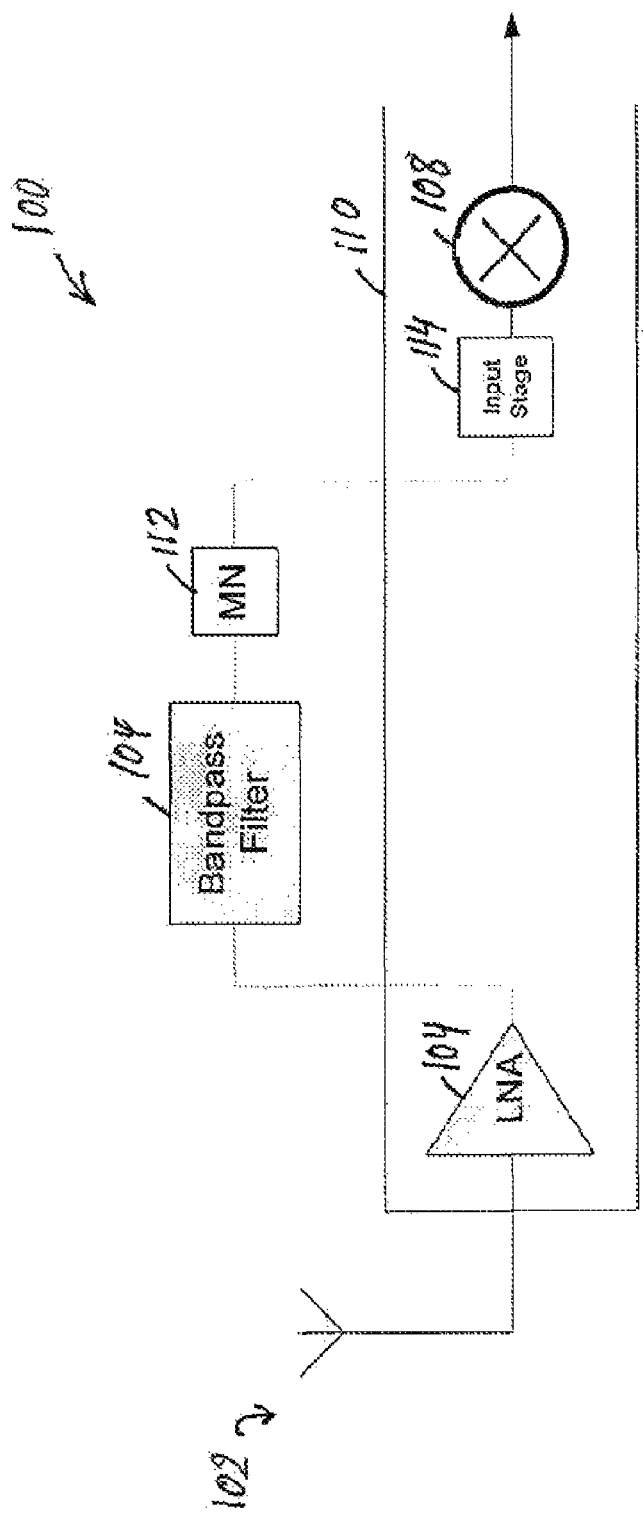
FIG. 1 shows a portion of receive chain in the transceiver of a wireless device.
Figure 2:
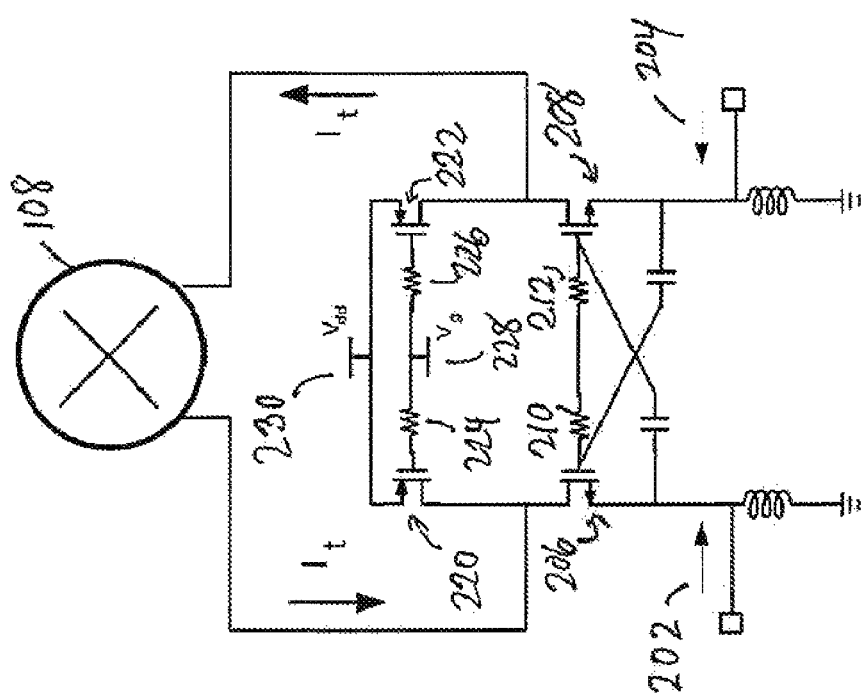
FIG. 2 is a block diagram of a common-gate only (CGO) input stage of the mixer in the receive chain of FIG. 1.
Figure 3:
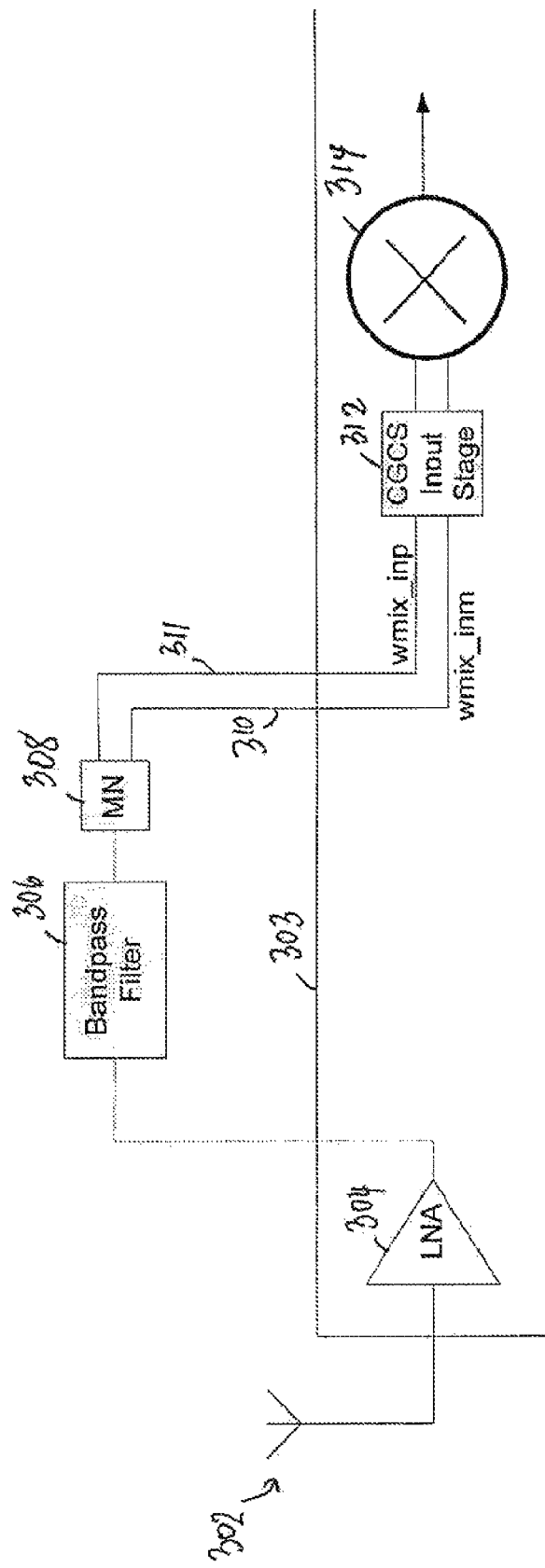
FIG. 3 shows a portion of a receive chain in a transceiver of a wireless device including a common-gate common-source (CGCS) input stage to the mixer.

FIG. 3 is a block diagram of a portion of a wireless device receiver chain including a mixer with a common-gate common-source (CGCS) input stage according to an embodiment.

RF signals received by antenna 302 are amplified by LNA 304 provided on a chip 303. The amplified signals are passed off-chip to a bandpass filter 306. A matching network 308 provides impedance matching for transmitting the filtered signals 310, 311 back on to chip 303. The differential signals are input to CGCS input stage 312 of mixer 314, which downconverts the signals to baseband or some intermediate frequency.

Figure 4:
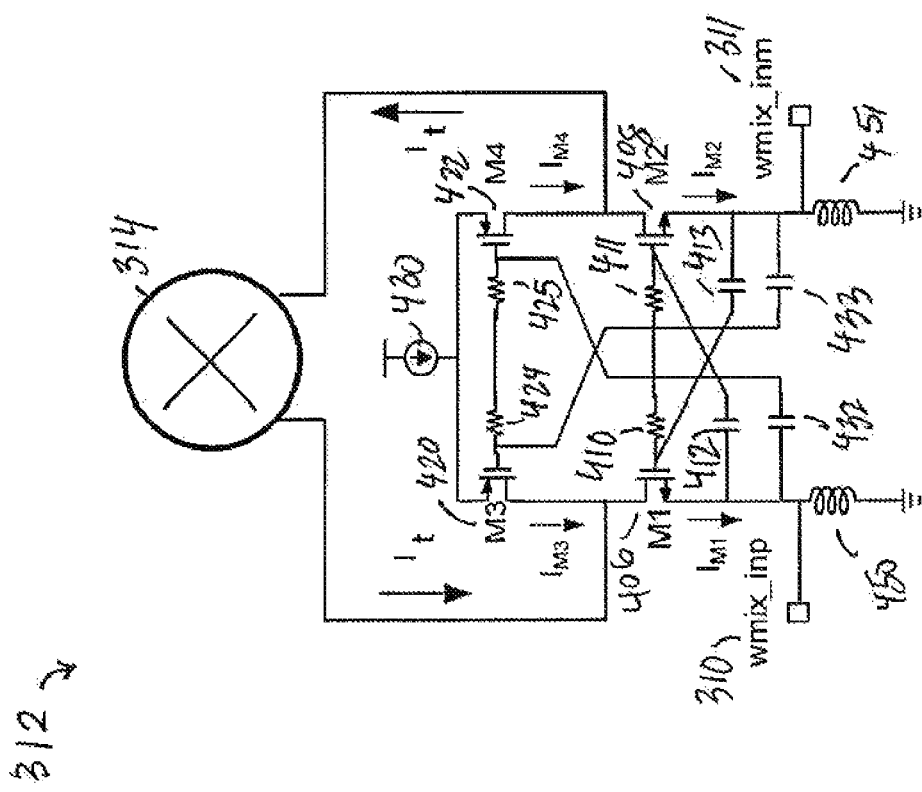
FIG. 4 illustrates an exemplary CGCS input stage.

FIG. 4. is a schematic diagram of the CGCS input stage 312 according to an embodiment. Differential input signals wimx_inp 310 and wmix_inm 311 from the matching network are provided at the sources of NMOS transistors M1 406 and M2 408, respectively. The differential input signals are 180° out of phase. The gates of NMOS transistors 406, 408 are coupled through resistors 410, 411, providing the "common-gate" aspect of the circuit. The gate of each NMOS transistor 406, 408 is also cross-coupled to the opposite input signal than its source through capacitors 412, 413, respectively. Current is generated through each NMOS transistor in response to the input signals at its gate and source.

PMOS transistors M3 420 and M4 422 are connected at their gates through resistors 424, 425. The sources of the PMOS transistors are tied to current source 430, providing the "common-source" aspect of the circuit. Like NMOS transistors 306, 408, the gate of each PMOS transistor 420, 422 is cross-coupled to the opposite input signal than its source through capacitors 432, 433, respectively. Current is generated through each PMOS transistor in response to the input signal at its gate and the current provided by current source 320. The total current $I_t$ is the sum of the current through the PMOS transistor and NMOS transistor on each column of the input stage.

Inductors 450 and 451 are coupled between the sources of the NMOS transistors 406 and 408, respectively, and a ground terminal. The inductors operative as RF choke inductors and exhibit high impedance at the operating frequency so that most signal current flow up into the transistors instead of ground during operation.

Figure 5:
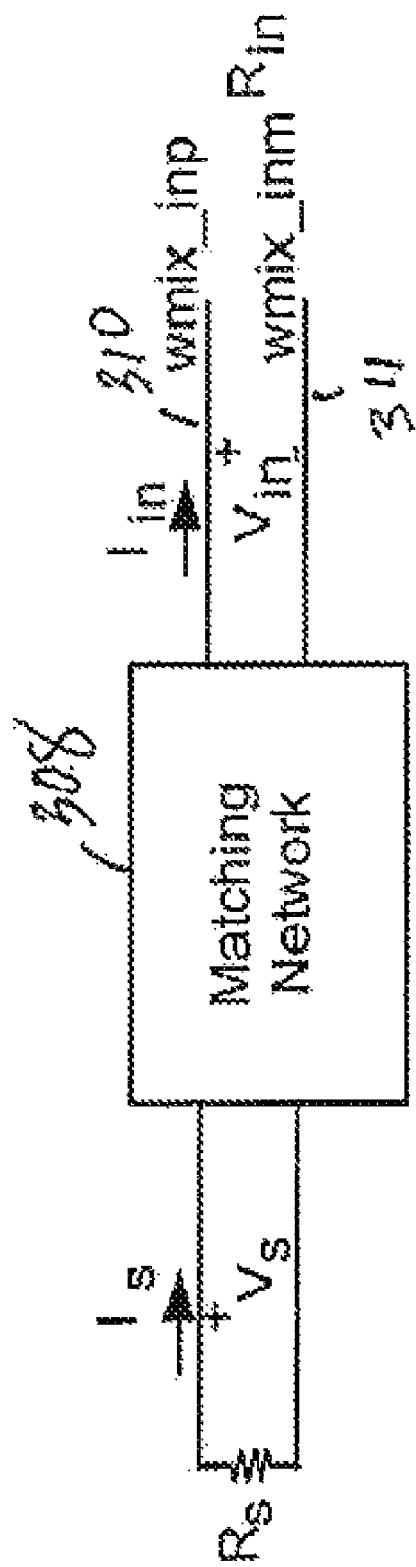
FIG. 5 is a block diagram of the signals input and output from the matching network.

A potential advantage of the CGCS input stage over the existing CGO transconductance stage configuration is that by adding a common-source stage through the PMOS differential-pair 420, 422, the transconductance gain is decoupled from the high Q matching network 308. FIG. 5 shows the signals at the input and output of the matching network 308. Assuming the matching network 308 is lossless, then:

$$\frac{I_{in}}{I_s} = \sqrt{\frac{R_s}{R_{in}}} \quad \text{and} \quad \frac{V_{in}}{V_s} = \sqrt{\frac{R_{in}}{R_s}} \quad \text{where } R_{in} = \frac{1}{g_{mn}}$$

and $g_{mn}$ is the transconductance of the NMOS transistors.

Referring back the FIG. 4, the output current $I_t$ of the CGCS input stage 312 is given by the following equation:

$$I_t = I_s \sqrt{\frac{R_s}{R_{in}}} + g_{mp} V_s \sqrt{\frac{R_{in}}{R_s}} = V_s \frac{1}{\sqrt{R_s}} \left( \sqrt{g_{mn}} + \frac{g_{mp}}{\sqrt{g_{mn}}} \right),$$

where $g_{mp}$ is the transconductance of the PMOS transistors.

for a CGO stage, only the first term, $\sqrt{g_{mn}}$, exists. In order to achieve high gain, the NMOS transconductance $g_{mn}$ has to be sufficiently large, which in turn requires a very high Q matching network. In practice, providing a matching network with a very high Q factor may be difficult to implement and may increase the cost of external components.

The addition of the common-source stage adds the second term, $$\frac{g_{mp}}{\sqrt{g_{mn}}}$$

and will compensate for the gain if $g_{mn}$ is not sufficiently high and also relax the Q matching factor. Intuitively, to get high gain from a CGO transconductance stage, the voltage $V_{in}$ should be as small as possible, however low Q matching will cause $V_{in}$ to increase and cause a gain drop from the CGO stage. However, with the addition of the voltage-driven common-stage PMOS differential-pair, the $V_{in}$ increase may produce more current from the common-source stage and thus compensate the gain loss in the common-gate NMOS stage. This is an advantage of combining common-gate and common-source stages without introducing a power consumption penalty.

In an embodiment, a CGCS input stage for a receiver chain includes NMOS transistors M1 406 and M2 408 having a width of 300 μm and a length of 0.24 μm, and PMOS transistors M3 420 and M4 422 having a width of 240 μm and a length of 0.24 μm. The cross-coupled capacitors 412, 413 for the NMOS transistors may be about 6 pF, and cross-coupled capacitors 432, 433 for the PMOS transistors may be about 3 pF. The four resistors 410, 411, 424, and 425 may be about 10 kΩ and the two inductors 450, 451 may be about 9 nH.

A number of embodiments have been described. Nevertheless, it will be understood that various modifications may be made without departing from the spirit and scope of the invention. For example, the CSCG mixer input stage may be used in a variety of wireless devices having similar receivers, including those designed for use in wireless network systems, wireless local area networks, and/or wireless personal area networks. Accordingly, other embodiments are within the scope of the following claims.

What is claimed is:

1. A method of downconverting a received radio-frequency (RF) signal in a wireless device, comprising:
   receiving the RF signal at an antenna in the wireless device;
   amplifying the received RF signal;
   filtering the amplified RF signals using a filter having an impedance matching that of a mixer via a matching network;
   inputting the filtered, amplified RF signals as a differential input signal to a common-gate common-source (CGCS) mixer input stage;
   mixing the filtered, amplified RF signals to output a downconverted RF signal by:
      conducting the differential input signal to a common-gate stage and to a common-source stage of the CGCS mixer input stage by conducting the differential input signal to a gate and source of each transistor forming the common-gate stage and to a gate of each transistor forming the common-source stage of the CGCS mixer input stage;
      conducting a signal from a common current source to a source of each transistor forming the common-source stage of the CGCS mixer input stage; and
      conducting a signal appearing at a drain of each transistor forming the common-source stage of the CGCS mixer input stage to a corresponding drain of each transistor forming the common-gate stage of the CGCS mixer input stage; and
   outputting the downconverted RF signal.

2. The method of downconverting a received radio-frequency (RF) signal in a wireless device as recited in claim 1, wherein
   the current of the outputted downconverted RF signal satisfies the equation:

$$I_t = V_s \frac{1}{\sqrt{R_s}} \left( \sqrt{g_{mn}} + \frac{g_{mp}}{\sqrt{g_{mn}}} \right)$$

where $I_t$ is the output current, $V_s$ is a voltage at an input of the matching network, $R_s$, is a matching resistance, $g_{mn}$ is the transconductance of the transistors in the common-gate stage, and $g_{mp}$ is the transconductance of the transistors in the common-source stage.

3. The method of downconverting a received radio-frequency (RF) signal in a wireless device as recited in claim 1, further comprising:
decoupling a transconductance gain of the matching network.

4. A wireless device comprising:
means for receiving the RF signal at an antenna in the wireless device;
means for amplifying the received RF signal;
means for filtering the amplified RF signals using a filter having an impedance matching that of a mixer via a matching network;
means for inputting the filtered, amplified RF signals as a differential input signal to a common-gate common-source (CGCS) mixer input stage means for mixing the filtered, amplified RF signals to output a downconverted RF signal comprising:
   means for conducting the differential input signal to a common-gate stage and common-source stage of the CGCS mixer input stage by conducting the differential input signal to a gate and source of each transistor forming the common-gate stage and to a gate of each transistor forming the common-source stage of the CGCS mixer input stage;
   means for conducting a signal from a common current source to a source of each transistor forming the common-source stage of the CGCS mixer input stage; and
   means for conducting a signal appearing at a drain of each transistor forming the common-source stage of the CGCS mixer input stage to a corresponding drain of each transistor forming the common-gate stage of the CGCS mixer input stage; and
   means for outputting the downconverted RF signal.

5. The wireless device of claim 4, wherein
the current the outputted downconverted RF signal satisfies the equation:

$$I_t = V_s \frac{1}{\sqrt{R_s}} \left( \sqrt{g_{mn}} + \frac{g_{mp}}{\sqrt{g_{mn}}} \right)$$

where $I_t$ is the output current, $V_s$ is a voltage at an input of the matching network, $R_s$ is a matching resistance, $g_{mn}$ is the transconductance of the transistors in the common-gate stage, and $g_{mp}$ is the transconductance of the transistors in the common-source stage.

6. The wireless device of claim 4, further comprising:
means for decoupling a transconductance gain of the matching network.

* * * * *